United States Patent [19]

Lyon et al.

[11] Patent Number: 4,972,144

[45] Date of Patent: Nov. 20, 1990

[54] TESTABLE MULTIPLE CHANNEL DECODER

[75] Inventors: Jose A. Lyon; Paul D. Shannon, both of Austin, Tex.

[73] Assignee: Motorola, Inc., Schaumburg, Ill.

[21] Appl. No.: 442,266

[22] Filed: Nov. 28, 1989

[51] Int. Cl.⁵ .................... G01R 31/28; G06F 11/00
[52] U.S. Cl. .................... 524/158 T; 324/73.1; 324/158 R; 371/22.1; 371/22.6; 371/25.1
[58] Field of Search .............. 324/158 T, 158 R, 415; 371/15.1, 21.1, 25.1, 22.1, 22.6; 307/243, 551, 572

[56] References Cited

U.S. PATENT DOCUMENTS

| | | | |
|---|---|---|---|
| 3,919,504 | 11/1975 | Crosley et al. | 324/415 |
| 4,625,310 | 11/1986 | Mercer | 371/22.1 |
| 4,674,090 | 6/1987 | Chen et al. | 371/25.1 |
| 4,724,341 | 2/1988 | Yamada et al. | 307/243 |
| 4,789,825 | 12/1988 | Carelli et al. | 324/158 T |
| 4,893,311 | 1/1990 | Hunter et al. | 371/25.1 |

FOREIGN PATENT DOCUMENTS 0035661  2/1987  Japan .................. 324/158 T

Primary Examiner—Reinhard J. Eisenzopf
Assistant Examiner—Vinh P. Nguyen
Attorney, Agent, or Firm—Robert L. King

[57] ABSTRACT

Transistors in a transistor array constructed in a testable multiple channel decoder are tested by setting the array in a test mode. A stuck low test, which detects an open circuit between a source and drain of a transistor, is executed by providing all address lines a first predetermined logic value. A stuck high test, which detects a short between a source and drain of a transistor, is executed by providing a first address line tested a second predetermined logic value and a second logic address line tested the first logic value.

8 Claims, 4 Drawing Sheets

TESTABLE MULTIPLE CHANNEL DECODER

FIELD OF THE INVENTION

This invention refers to the testing of microcomputers, and more particularly, to generation of test patterns for verifying functionality of a microcomputer.

BACKGROUND OF THE INVENTION

The current market expects delivery of fault-free parts to the user. Delivery of fault-free parts can only be assured if the test procedures catch all possible faults. Part of a known test procedure for microcomputers is the running of a test program, a sequence of microcomputer instructions called test patterns, which exercise and monitor all elements of the microcomputer's operation.

The starting point for test pattern development is the generation of a long sequence of instructions which will, in the judgment of a designer, thoroughly and completely exercise all functions of the microcomputer to be tested. Next, these initial test patterns are fault graded by any of several commonly available logic simulators. The result of fault grading is a list of undetected possible faults. This list usually contains many thousand fault names, wherein a fault name is a node name and an associated fault condition such as "stuck high" or "stuck low". Each fault name in this list must be analyzed and a sequence of instructions devised which will detect the fault condition.

The task of developing test patterns of the highest quality is a tedious and time-consuming task frequently requiring complex and ingenious instruction sequences in order to exercise and monitor deeply embedded circuitry. Modifications to the microcomputer design and its testing procedures are needed to make the development of test patterns more straightforward and considerably less time consuming for the test engineer.

FIG. 1 is a block diagram of a known decoder 1. Address signals are provided to address lines A1-An which are each coupled to one of inverters I1-In and to a transistor array 2. Thus, address signals and inverted address signals are provided to the transistor array 2. The transistor array 2 is an array of transistors and may be implemented as one of a variety of well-known arrays. The decoder 1 also has output lines S1-Sm from the transistor array 2. The logic value of each of address signals A1-An make predetermined transistors in transistor array 2 turn on and turn off so that one of the output lines S1-Sm becomes a logic high level.

It is important that transistors in the transistor array 2 correctly turn on and turn off in response to the address signals to produce a decoded signal on output lines S1-Sm. In the manufacture of transistor array 2 it is important to produce a one hundred percent functional transistor array. To manually check or verify functionality of a large transistor array is time consuming and very costly.

SUMMARY OF THE INVENTION

It is an object of the present invention to provide an improved testable multiple channel decoder.

It is another object of the present invention to provide an improved method of developing test patterns for determining functionality in a semiconductor device.

According to the present invention, a testable multiple channel decoder includes a transistor array, a logic address apparatus, a logic readout apparatus and a control apparatus. The transistor array is constructed by a plurality of channels each having a plurality of transistors connected in series. Each gate of the transistors is connected to the logic address apparatus. Transistors, in response to signals from the logic address apparatus, turn on or turn off. The channel decoder, in response to a test signal provided to the logic address apparatus, is set to test modes. When any transistor in the array fails, the logic readout apparatus provides an indication of a failure.

DESCRIPTION OF THE PREFERRED EMBODIMENT

The terms "low level" or "low" and "high level" or "high" used herein assume that the illustrated circuitry is implemented in positive logic. It should be clear that the present invention may be implemented in negative logic with logic circuitry having states opposite to what is described herein. It should also be clear herein that a "node" is equivalent to a "signal" and that signal labels are synonomous with node labels.

Figure 1:
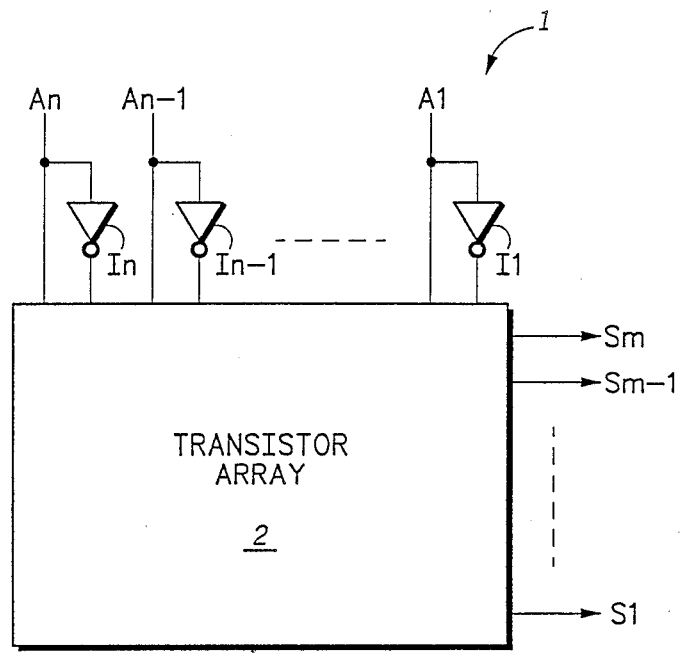
FIG. 1 illustrates in block diagram form a known decoder.
Figure 2:
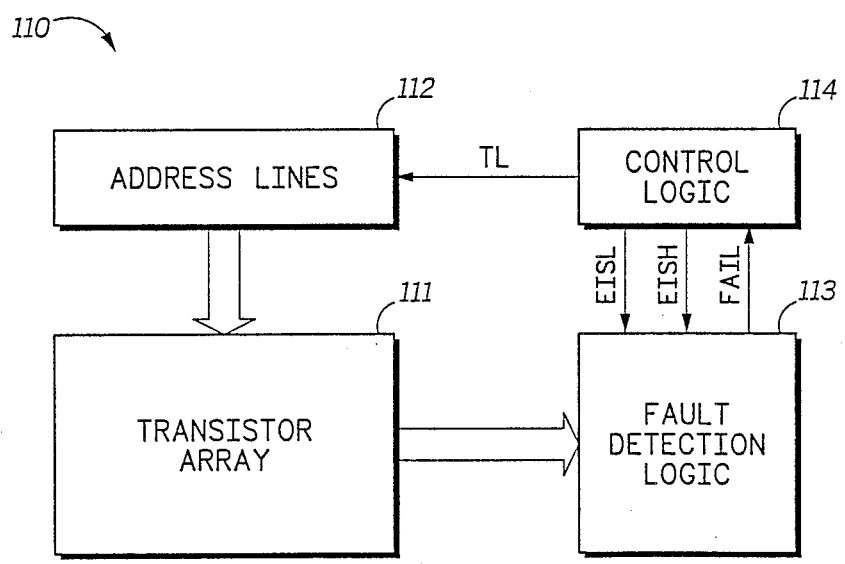
FIG. 2 illustrates in block diagram form a testable decoder in accordance with the present invention.

Shown in FIG. 2 is a block diagram of a testable decoder 110 in accordance with the present invention. Decoder 110 generally comprises a transistor array 111 which receives addresses via address lines from an address portion 112. Transistor array 111 provides outputs to fault detection logic 113. Control logic 114 is coupled to both fault detection logic 113 and address portion 112. Control logic 114 provides two control signals, each preferably implemented as a control bit, to fault detection logic 113. Control logic 114 provides both an Enable Input Stuck Low Test (EISL) control bit and an Enable Input Stuck High Test (EISH) control bit to fault detection logic 113. Fault detection logic 113 provides a test FAIL control signal, preferably implemented as a bit, to control logic 114. Control logic 114 is connected to address portion 112 via a test line, TL, and provides a control signal to address portion 112 as described below.

Figure 3A:
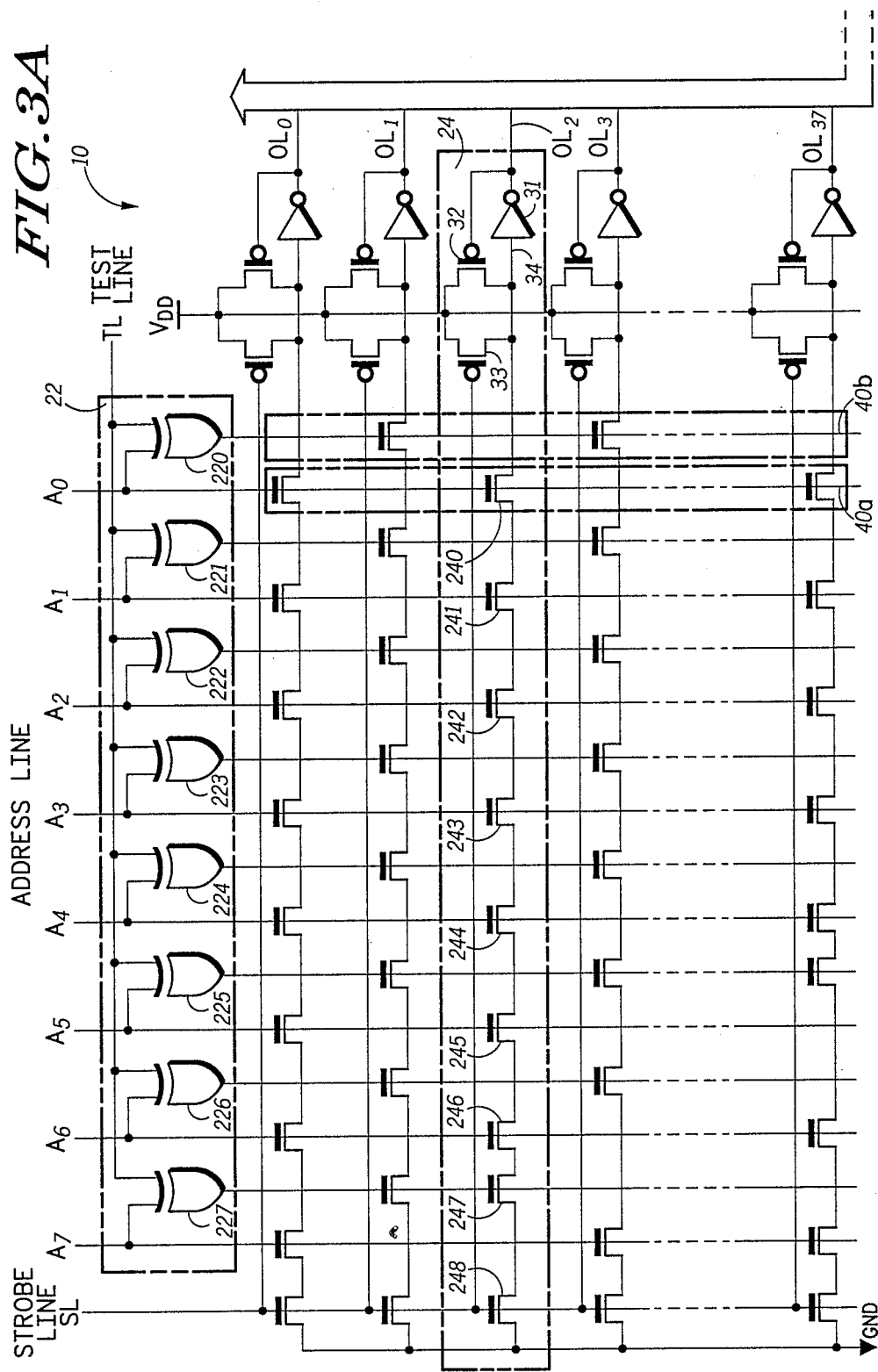
FIGS. 3A and 3B illustrate in partial schematic form a decoder circuit in accordance with the present invention.
Figure 3B:
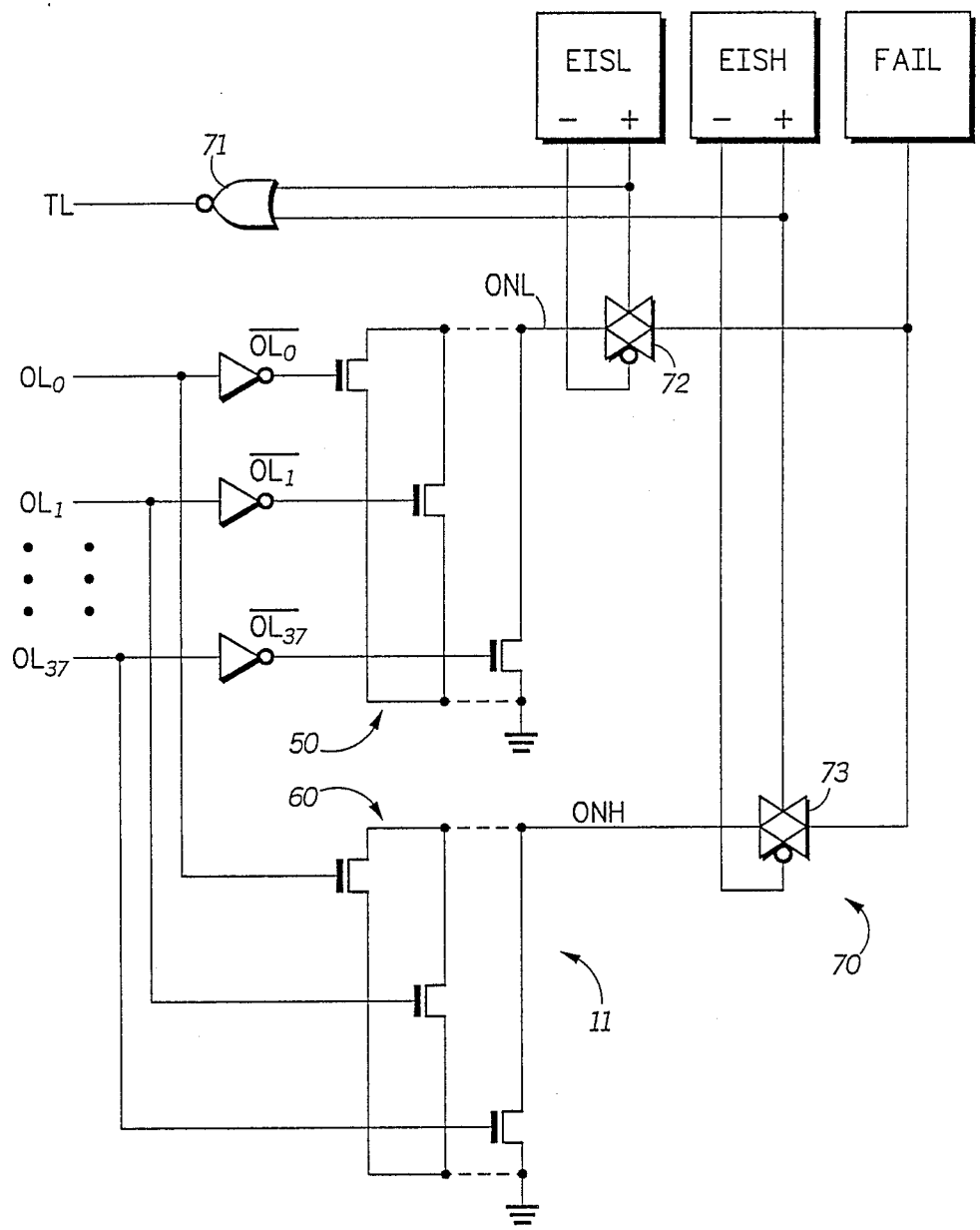

Referring to FIGS. 3A and 3B, one embodiment of a decoder 10 illustrating this invention is explained in detail. In FIG. 3A, when address signals on address lines A0-A7 and a strobe signal on a strobe line SL are provided, an output signal as determined by the address signals is produced on an output line, OL.

In FIG. 3A, address lines A0-A7 are coupled through a logic address apparatus 22 to a transistor array. In the logic address apparatus 22, a plurality of exclusive OR circuits 220-227 is provided with each OR circuit having one input commonly connected. Each of the address lines A0-A7 is connected to a first input of one of exclusive OR circuits 220-227 and to predetermined gates of transistors in the transistor array as a first address line 40a which is highlighted for convenience of illustration by a dashed line rectangle. Second inputs of each of exclusive OR circuits 220-227 are connected together to a test line TL. Each output of the exclusive OR circuits 220–227, such as 40b which is also highlighted by a dashed line rectangle, is connected to predetermined gates of transistors in the array.

In the illustrated form of FIG. 3A, the transistor array comprises a plurality of channels having N-channel transistors 240–248 connected in series and an output latch portion which is formed by an inverter 31 and P-channel transistors 32 and 33. A source of transistor 240 is connected to a drain of transistor 241. Sources and drains of transistors 241–247 are connected in the same way. A source of transistor 248 located at one end of a channel is connected to ground potential, and a drain of transistor 240 located at an opposite end of the channel is connected to an input of the inverter 31 and to sources of transistors 32 and 33. An output of inverter 31 is connected to the gate of transistor 32 and to an output line OL2. Drains of each of transistors 32 and 33 are connected to a positive power supply voltage $V_{DD}$. A gate of transistor 33 is connected to the strobe line SL. In this embodiment, thirty-eight channels are shown so that decoder 10 has thirty-eight output lines OL0–OL37. Since decoder 10 has eight address lines, decoder 10 can decode two-hundred fifty-six addresses, and more than thirty-eight channels may be constructed.

A test line TL is a signal line to provide signals which switch the decoder 10 to a normal operation mode or a test mode. In this embodiment, decoder 10 is set on the normal operation in a logic one or high level signal and on the test mode in a logic zero or low level signal.

FIG. 3B presents an embodiment of a readout circuit 11 to detect faults in the decoder 10 and control logic 70 to establish test modes and monitor test results. The readout circuit 11 contains a detect circuit 50 to detect a "gate stuck low" fault and a detect circuit 60 to detect a "gate stuck high" fault. The control logic 70 comprises bits EISL, EISH and FAIL which are typically stored in a status and control register (not shown) and circuitry described below for generating control signals.

In the illustrated form, detect circuit 50 comprises thirty-eight N-channel transistors (one for each output line OL) connected in parallel between an output signal, or node, labeled "ONL" and ground. Each output line OL drives the gate of one transistor through an inverter. If a fault exists, one output line OL will transition to a low logic level during the test and its corresponding inverter will turn on its associated transistor and pull the ONL node to ground level, thus detecting an input stuck low.

In the present embodiment, detect circuit 60 comprises thirty-eight N-channel transistors (one for each output line OL) connected in parallel between output node ONH and ground. Each output line OL drives the gate of one transistor. If a fault exists, one output line OL will go high during the test and its corresponding transistor will pull node ONH to ground level, thus detecting an input stuck high fault. Control logic 70 comprises three bits which are typically stored in a status and control register (not shown), a NOR gate 71 to generate the test line signal TL, and switches 72, 73 which connect either ONL or ONH to the status bit. Control bit EISL (Enable Input Stuck Low Test), when high, connects the output of detect circuit 50, ONL, to the status bit FAIL. Control bit EISH (Enable Input Stuck High Test), when high, connects the output ONH of detect circuit 60 to the status bit FAIL. If during a test the output node connected to the FAIL bit goes low, the FAIL bit latches the state for later output. The test line TL for controlling logic address apparatus 22 is the logical NOR of EISL and EISH. Not shown in FIG. 3B is conventional circuitry for precharging nodes ONL and ONH.

Normal Operation Mode (TL = 1)

In the normal operation mode, control bits EISH and EISL are off, or low level, so that the nodes ONL and ONH of the control logic 70 are not connected to FAIL. Referring again to FIG. 3A, in normal operation a logic high signal is provided to the test line TL. In this state, when address signals are provided to the address lines A0–A7, signals having the same corresponding logic level as address lines A0–A7 are respectively provided to a first plurality of address lines, and signals inverted by the exclusive OR circuits 220–227 are respectively provided to a second plurality of address lines.

When the strobe line SL signal transitions from a logic low to a high after address signals are provided, a logic high signal is produced from the output of the channel designated by the address signals by which all gates connected thereto are set to a high level so that all transistors connected thereto turn on. For example, when a logic high is given to address lines A0– A6, and a logic low is given to address line A7, transistors 240–247 turn on. After that, a signal line 34 keeps almost the same voltage level as the ground by applying the strobe line SL signal in a high logic state to the gate of transistor 248. A signal level of the signal line 34, which is a logic low, is inverted by an inverter 31 so that a decoded signal of a logic one is generated on the output line OL2.

Test Operation Mode (TL = 0)

Figure 4:
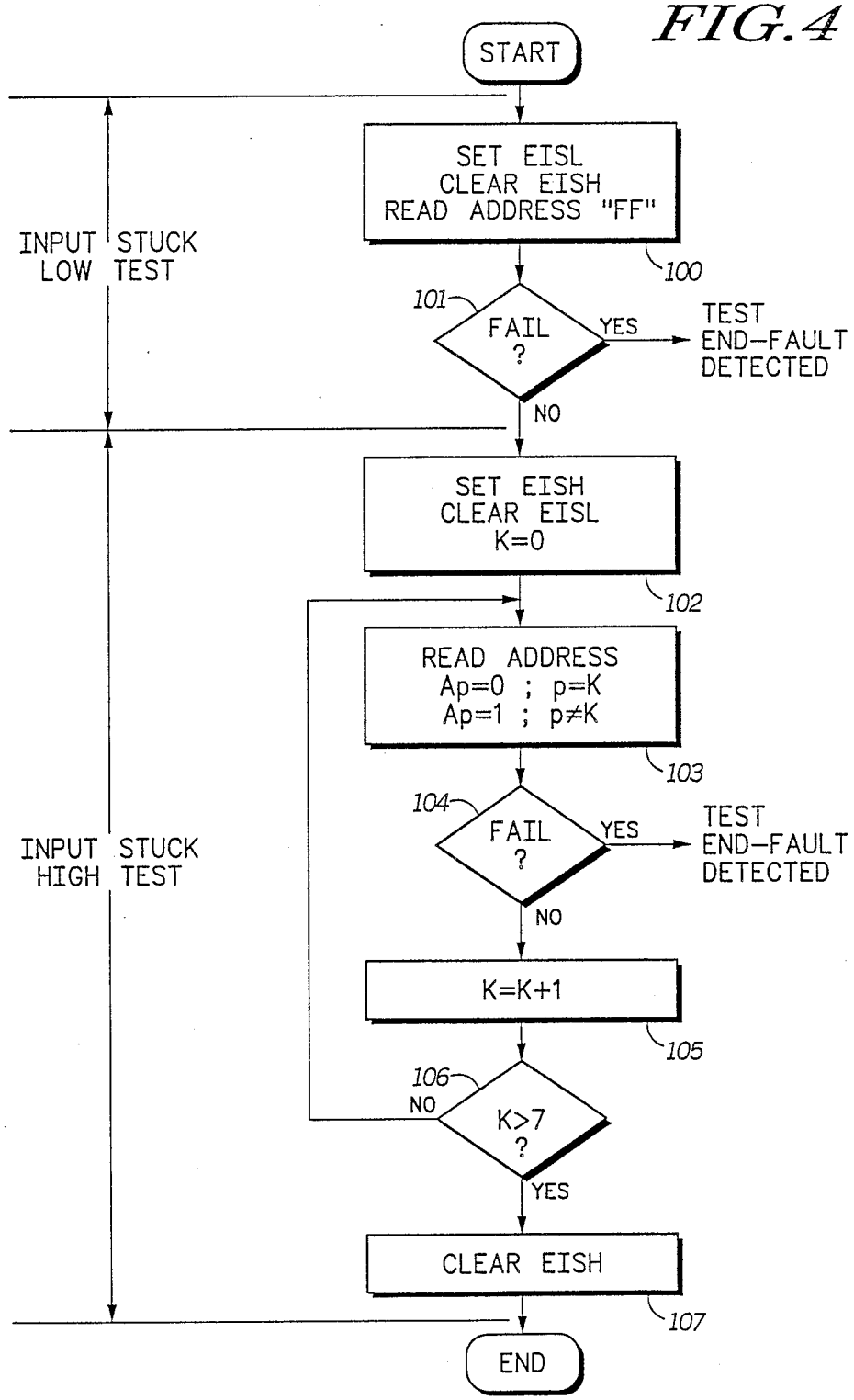
FIG. 4 illustrates a flow chart for testing the decoder.

The test procedure comprises the Input Stuck Low test followed by the Input Stuck High test. Although this order is illustrated in FIG. 4, it should be well understood that the order is arbitrary.

The Input Stuck Low test comprises the instruction sequence which sets the EISL bit, clears the EISH bit, and performs an access to an address of all one's (a read or write with address bits equal to one). If a fault exists, one of the outputs OL1–OL37 of FIG. 3A will be a zero, thereby driving node ONL low and setting the FAIL bit.

The Input Stuck High test comprises an instruction sequence which sets the EISH bit, clears the EISL bit, and performs m iterations of a loop, where m equals the number of address lines. One iteration comprises an access (Read or Write) with one address line at logic zero and all others at logic one. For each iteration, a different address line is held at zero. If a fault exists, at least one of the iterations will result in one of the output lines OL1–OL37 going high thereby driving node ONH low and setting the FAIL bit.

"Stuck Low" Test Mode

In this test mode, EISL is turned on and a logic "0" is provided to the test line TL. Next, the address lines A0–A7 are set to logic "1" so that high level signals are provided to all the gates of transistors connected to the first and second plurality of address lines because signals provided to the exclusive OR circuits 220–227 are not inverted. In this state, when the strobe signal transitions from low to high, if all transistors are conductive, signals of high level are produced at the output lines OL0-OL37. Therefore, no transistor in detect circuit 50 in FIG. 3B will turn on, and signal or node ONL remains high.

Next, operation of the decoder with a "stuck low" fault is explained below. For example, assume that a transistor 240 has a gate stuck low fault, that is, an open circuit between the source and the drain. Initially, high level signals are provided to the address lines A0-A7, and then the strobe signal changes from low level to high level. The signal line 34, however, does not change to the ground level because of an open circuit between the source and drain of transistor 240. The output line OL2 keeps a low level so that the inversion thereof goes high thereby turning on its associated transistor and pulling ONL low which sets the FAIL bit.

"Stuck High" Test Mode

In this test mode, a "stuck high" fault, that is, a short circuit between the source and drain of a transistor is detected. In this mode, every group of transistors coupled to each address line is examined.

Initially, EISH is turned on and a logic "0" is provided to the test line TL. Next, only address line A0 is set to a low level and address lines A1-A7 are each set to a high level. In this state, the strobe signal transitions from a low level to a high level. If all transistors coupled to the address line A0 are normally operating, a low level signal is provided from all output lines OL0-OL37 because all transistors coupled to the address line A0 turn off. Next, only address line A1 is set to a low level and all other address lines are set to a high level. As mentioned above, one address line which is associated with examined transistors is set to a low level and all other address lines are set to a high level.

The signal level of output lines OL0-OL37 is detected by the detect circuit 60 in the readout circuit 11. When low level signals are provided from all output lines OL0-OL37, all transistors in the detect circuit 60 remain off, and signal or node ONH remains high.

Next, assume that transistor 240 has a "stuck high" fault. As mentioned above, a low level signal is provided to the address line A0 and high level signals are provided to address lines A1-A7. After that, the strobe signal transitions from a low level to a high level. Transistor 240 does not turn off because of the stuck high fault, even when a low level signal is connected to the gate thereof. Therefore, the voltage of the drain of the transistor 240 is almost equal to the ground so that a high level signal is provided at the output line OL2. This high level signal is transmitted to the gate of the associated transistor in detect circuit 60 thereby pulling node ONH to ground and setting the FAIL bit.

FIG. 4 is a flow chart which shows the test procedure mentioned above. First of all, the "stuck low" test is executed in steps 100 and 101. In step 100, an instruction sequence is executed to set the decoder in the test mode so that the test line TL is fixed to a low level. Next, a READ instruction whose address is "FF" (hexadecimal notation) is executed to force all address lines to logic "1". Any instruction having address "FF" may be executed. When this instruction is executed, all address line A0-A7 are set to a high level and the strobe signal is provided on the strobe line SL. In step 101, the existence of stuck low faults is considered. If stuck low faults do not exist, that is the FAIL bit is clear, the test procedure is advanced to a next test mode.

In step 102, an instruction sequence is executed to set the decoder in the test mode. A variable K for counting tested address lines is initially set to zero because an address line tested is designated and a completion of testing is decided by the value of the variable K. In step 103, a READ instruction is executed to force an address line of the number equal to the variable K to logic zero and all other address lines to logic one. It should be understood that any instruction instead of the READ instruction may be executed. Step 104 is a procedure to decide whether a stuck-high fault exists in the decoder or not; that is, to determine whether or not the FAIL bit is set. When a "stuck high" fault is not detected, advancing to step 105, the variable K is incremented by one. In step 106, it is decided whether every address line has been tested. That is, since the decoder 10 has eight address lines in this embodiment, it is decided whether the variable K is greater than seven or not. When the variable K is equal to or less than seven, the procedure returns to step 103 because the test is not completed. When "stuck high" faults are not detected, the test mode is exited in step 107 and decoder 10 is returned to the normal operation mode by clearing EISH.

By now it should be apparent that an improved testable decoder has been provided which reduces test pattern generation complexity. The present invention simplifies test pattern generation for long strings of either stuck low or stuck high faults commonly found in address decoders and similar circuits. By reconfiguring register decoders during a test operation so that all registers map the same address, fault coverage of microcontroller register decoders is improved.

While I have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A testable multiple channel decoder for decoding any one of a predetermined plurality of input addresses by providing a decoded output indicating if one of the input addresses is received by the decoder, the decoder comprising:
   a transistor array including a plurality of channels arranged in columns, each column having a plurality of transistors connected in series, with each group of a first plurality of groups of predetermined transistors in predetermined columns having control electrodes connected together and to a predetermined one of a first plurality of address lines and each group of a second plurality of groups of predetermined transistors in predetermined columns having control electrodes connected together and to a predetermined one of a second plurality of address lines, and each of said columns having an output for collectively indicating receipt by the decoder of one of the predetermined addresses;
   logic address apparatus coupled to said first plurality of address lines and providing a predetermined address line of each of the first plurality of address lines in a logic state opposite to a logic state of a corresponding predetermined address line of each of the second address lines during a non-test mode, and providing a predetermined address line of each of the first address lines in a logic state equal to a logic state of a corresponding predetermined address line of each of the second address lines during first and second test modes, said logic address apparatus turning on all of said transistors in all of said columns during the first test mode and sequentially turning off each of said columns of transistors, one column at a time, with all other columns of transistors turned on during the second test mode; and logic readout apparatus coupled to the outputs of all of said columns and providing an indication of a transistor structural failure within said decoder if all of the outputs of the columns are not in a first predetermined state during the first test mode and if all of the outputs are not in a second predetermined state during the second test mode.

2. The testable multiple channel decoder of claim 1 further comprising:

control logic means coupled to the logic address apparatus and the logic readout apparatus, for providing first and second test mode signals and deriving a control signal therefrom for use with predetermined input addresses to control the turning on of all of the transistors in all of the columns of transistors in the first test mode and to control the sequential turning off of the columns of transistors in the second test mode, said first and second test mode signals also enabling the logic readout apparatus to provide said indication of transistor structural failure within the decoder.

3. A testable multiple channel decoder for decoding predetermined input addresses and providing an output indicating receipt of an input address having a predetermined value, said decoder comprising:

a transistor array including a plurality of columns each having a plurality of transistors connected in series, with control electrodes of each group of a first plurality of groups of predetermined transistors being connected together and to a predetermined one of a first plurality of address signals and a predetermined control electrode of each transistor in each group of a second plurality of groups of transistors being connected together and to a predetermined one of a second plurality of address signals, and each of said columns having an output for collectively providing the decoder output; and a plurality of logic gates each having a first and a second input terminal and an output terminal, with each of the first input terminals of the logic gates being coupled to a predetermined different one of the first plurality of address signals, each of the second input terminals of the logic gates being connected together and to a test control signal, and each of the output terminals of the logic gates providing a predetermined one of the second plurality of address signals, each logic gate providing one of the second plurality of address signals in a logic state opposite a logic state of the address signal of the first plurality coupled to the first input thereof during a normal mode of operation, and each logic gate providing one of the second plurality of address signals in a logic state equal to a logic state of the address signal of the first plurality coupled to the first input thereof during first or second test modes of the decoder, said decoder output providing a multiple bit test signal output to indicate functionality of the decoder in response to the test control signal and the first and second pluralities of address signals.

4. The testable multiple channel decoder as claimed in claim 3 further comprising a logic readout apparatus connected to the test signal output for selectively providing a single bit test output indicating either proper functioning or failure of the decoder operation.

5. The testable multiple channel decoder as claimed in claim 4 wherein the logic readout apparatus comprises circuitry which combines each bit of the decoder output in an AND function to indicate whether all of the bits have a predetermined logic state.

6. The testable multiple channel decoder as claimed in claim 5 wherein the logic readout apparatus reads each of the outputs of the plurality of columns in a predetermined sequence and indicates whether all of the outputs have the predetermined logic state.

7. In a multiple channel decoder for providing a predetermined decoder output in response to receipt of a predetermined input address signal with each channel having a plurality of transistors connected in series and an output which is provided by a current electrode of a predetermined one of the transistors of each channel, a method of decoding in a first mode and testing each transistor in each channel for functional operation in a second mode, comprising the steps of:

during the first mode: (1) receiving the predetermined input address signal and supplying each signal of a plurality of pairs of signals to a control electrode of each of predetermined transistors in a predetermined one of a plurality of groups of transistors, signals of each pair of the signals having opposite logic states; and (2) providing the predetermined decoder output; and during the second mode: (1) supplying each signal of the pairs of signals to a control electrode of each of the transistors in a predetermined one of the groups of transistors for substantially simultaneously making all of said transistors conductive, signals of each pair of the signals having identical logic states; and (2) using the outputs of all channels and providing a pass/fail signal indicating that the decoder is functional when the outputs all have a predetermined value.

8. The method as claimed in claim 7 wherein during the second mode and after providing the pass/fail signal, further comprising the steps of:

(3) supplying a series of predetermined input address signals to said decoder for sequentially turning off, one at a time, all transistors in each channel of said decoder, and (4) using the outputs of each channel during the sequence to continue providing a pass/fail signal indicating that the decoder is fully functional if all the outputs are identical throughout the sequence.

* * * * *